United States Patent
Kouwenhoven

(10) Patent No.: US 7,702,377 B2
(45) Date of Patent: Apr. 20, 2010

(54) MAGNETIC RESONANCE IMAGING

(75) Inventor: Marc Kouwenhoven, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 672 days.

(21) Appl. No.: 11/568,226

(22) PCT Filed: Apr. 21, 2005

(86) PCT No.: PCT/IB2005/051300
§ 371 (c)(1),
(2), (4) Date: Oct. 24, 2006

(87) PCT Pub. No.: WO2005/103750
PCT Pub. Date: Nov. 3, 2005

(65) Prior Publication Data
US 2008/0154121 A1 Jun. 26, 2008

(30) Foreign Application Priority Data
Apr. 27, 2004 (EP) .................................. 04101750

(51) Int. Cl.
A61B 5/055 (2006.01)

(52) U.S. Cl. .................................................... 600/413
(58) Field of Classification Search ................ 600/413, 600/521, 419, 509, 411, 410, 427, 409; 324/306, 324/309
See application file for complete search history.

(56) References Cited

U.S. PATENT DOCUMENTS

| 4,710,717 | A | * | 12/1987 | Pelc et al. | .................. | 324/309 |
| 5,000,182 | A | * | 3/1991 | Hinks | ......................... | 600/413 |
| 6,070,097 | A | * | 5/2000 | Kreger et al. | ............... | 600/521 |
| 6,078,175 | A | * | 6/2000 | Foo | ............. | 324/306 |
| 6,611,701 | B2 | * | 8/2003 | Foo | ............. | 600/413 |
| 2004/0030234 | A1 | | 2/2004 | Hayek | | |

FOREIGN PATENT DOCUMENTS

| EP | 0 256 584 A1 | 2/1988 |
| EP | 0 412 695 A2 | 2/1991 |
| WO | WO 9904688 A1 | 2/1999 |

OTHER PUBLICATIONS

Vlaardingerbroek, M.T., et al.; Magnetic Resonance Imaging, 1999; 2nd Ed.; Springer Verlag Berlin; pp. 354-360.
Kalman, R.E.; A New Approach to Linear Filtering and Prediction Problems; 1960; Journal of Basic Engineering; pp. 35-45.

* cited by examiner

Primary Examiner—Eric F Winakur
Assistant Examiner—Lawrence N Laryea

(57) ABSTRACT

A magnetic resonance imaging method involves detection of a series of trigger events and acquisition of successive segments of magnetic resonance signals from respective segments of k-space. The occurrence of the next trigger event is predicted, e.g. by way of a running average, on the basis of the detected series of trigger events. Acquisition of at least one individual segment of magnetic resonance signals is triggered on the basis of the occurrence of the predicted trigger event. Triggering of the acquisition is based on the predicted trigger event, e.g. in that the instant and duration of the acquisition is adjusted on the basis of the prediction of the trigger event. Finally, a magnetic resonance image is reconstructed from several segments of magnetic resonance signals.

18 Claims, 2 Drawing Sheets

MAGNETIC RESONANCE IMAGING

Figure 1:
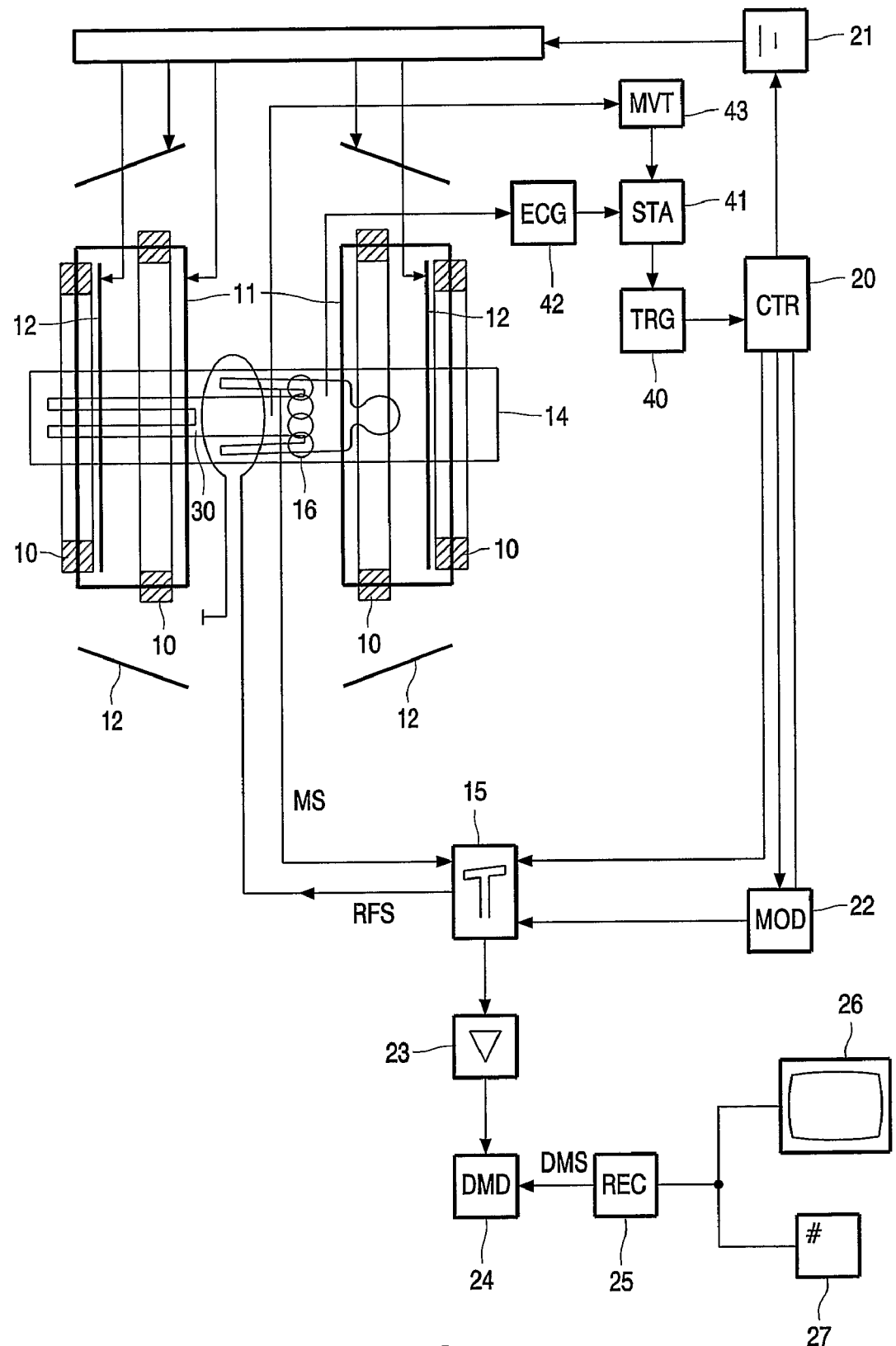

The invention relates to a magnetic resonance imaging method in which magnetic resonance signals are acquired from a dynamically varying object and a magnetic resonance image is reconstructed from the magnetic resonance signals.

From the handbook 'Magnetic Resonance Imaging,' by M. T. Vlaardingerbroek and J. A. den Boer, ($2^{nd}$ edition, Springer Verlag Berlin, 1999) such a magnetic resonance imaging method is known which is in particular directed to imaging the beating heart of the patient to be examined. The movement and changes in shape and size of the beating heart form the dynamic variations of the object.

The handbook 'Magnetic Resonance Imaging,' by M. T. Vlaardingerbroek and J. A. den Boer, ($2^{nd}$ edition, Springer Verlag Berlin, 1999) mentions that a way to cope with cardiac motion in magnetic resonance imaging is to trigger the acquisition of the magnetic resonance signals by the cardiac rhythm using an electrocardiogram (ECG). Profiles of magnetic resonance signals are acquired in the same heart phase where the heart has returned to the same position. At a predetermined delay after a detected R-peak only one profile is measured and the rest of the R-R interval can be used for the acquisition of data from other slices.

An object of the invention is to provide an magnetic resonance imaging method achieving an improved image quality and efficiency of the signal acquisition in order to image dynamic variations of an object.

This object is achieved by the magnetic resonance imaging method according to the invention, wherein a series of trigger events is detected segments of magnetic resonance signals are acquired from respective segments of k-space upon a respective detected trigger events and the acquisition of an individual segment of magnetic resonance signals upon its detected trigger event is dependent on previously detected trigger events.

The present invention is based on the insight that irregularities or changes in the dynamic variations can be prospectively taken into account. Notably, the dynamic variations often involve some degree of regularity, such as some periodicity. Taking previously detected trigger events in to account when setting the acquisition of the current segment of magnetic resonance signals achieves that the changes in the dynamic variations are appropriately taken into account in the acquisition of the current segment of magnetic resonance signals. For example, slow drift of the periodicity of e.g. the heartbeat of the patient to be examined is accurately taken into account. Hence, errors that are due to incorrect or no accounting for changes in the dynamic variations are reduced or avoided. Thus, perturbations, e.g. motion artifacts, in the reconstructed magnetic resonance image are avoided. In addition the efficiency of the signal acquisition is improved because there is no need to discard magnetic resonance signals that were acquired incorrectly in relation to their detected trigger event.

Magnetic resonance signals are acquired in the form of respective segments. Individual segments of magnetic resonance signals are acquired by scanning respective segments of k-space. In particular lines or groups of a small number of lines in k-space form such segments of k-space. The magnetic resonance image is reconstructed from the magnetic resonance signals from several segments of magnetic resonance signals. These respective magnetic resonance signals are acquired upon different trigger events. According to the invention the next trigger event is predicted on the basis of a series of earlier trigger events. A typical trigger event in cardiac magnetic resonance imaging is the detection of an R-peak in the patient's ECG. On the basis of the prediction of the next trigger event and the actual occurrence of that next trigger event the acquisition of the next segment of magnetic resonance signals is set. The setting of the acquisition may involve the instant and duration of the acquisition upon the current trigger event of the current segment of magnetic resonance signals, or the setting may involve that the acquisition foreseen upon the current trigger event is discarded and that the next acquisition is done at a later occurring trigger event. For example, when the diff It is noted that the paper '*Sub-millimetre three-dimensional coronary MR-angiography with real-time navigator correction: comparison of navigator locations*' in Radiology 212 (1999)579-587 by M. Stuber et al, reports to employ a trigger delay with respect to the R-wave of the ECG that linearly depends on the difference between time between two subsequent R-waves (the R-R interval), i.e. the actual heart rate, and the duration of the systole. Further, this paper mentions that advantage is taken of the relatively constant duration of the systolic part of the cardiac cycle.

These and other aspects of the invention will be further elaborated with reference to the embodiments defined in the dependent Claims.

According to one aspect of the invention, the actual instant of the detected current trigger event is compared with the prediction of the current trigger event. The acquisition of the current segment of magnetic resonance signals is done in dependence of this comparison. Notably, when the actual instant of the trigger event differs significantly, e.g. the difference between the actual instant and its prediction being larger than a pre-determined threshold value, the acquisition of the current segment of magnetic resonance signals is discarded and carried out again upon a next trigger event. Such a significant difference between the actual and predicted instant of the current trigger event signals a substantial deviation of the regularity of the dynamic variations. Accordingly, the acquisition of the current segment of magnetic resonance signals is very likely to be affected by artifacts, such as motion artifacts. Discarding and re-acquisition of the current segment of magnetic resonance signals avoids these artifacts to proliferate into the reconstructed magnetic resonance image.

According to a further aspect of the invention, a selection of trigger events of the detected series is made and the dependence of the acquisition of the current segment of magnetic resonance signals is made on the basis of the selected trigger events. This aspect of the invention is based on the insight that in many situations it is possible to distinguish trigger events that pertain to a regular dynamic behavior of the dynamics from trigger events that reflect irregularities of the dynamic behavior. Part of the detected trigger events, notably trigger events that reflect irregular dynamic behavior are not taken into account for the prediction of the next trigger event. In this way, erroneous trigger events, or trigger events that are due to irregularities which are not included in the selection do not adversely affect the prediction of the next trigger event. Hence, a more accurate prediction of this next trigger event is achieved.

The selection of trigger events can be done on the basis of monitoring events. These monitoring events are other events than the trigger events. These monitoring events represent the dynamic behavior of a phenomenon that is different from the phenomenon on which the triggering events are based. Notably in cardiac magnetic resonance imaging, the triggering is typically based on the ECG signal and the monitoring events concern a respiration state of the patient to be examined. In particular, the trigger events formed by R-peaks in the ECG can be selected on the basis of coincidence with either the occurrence of an expiration state or of an inspiration state of the patient's breathing. Another example of a monitor event that can be employed for the selection of trigger event is the motion of the patient. To detect the patient's respiration state, for example, motion of the patient's chest can be also used.

According to a further aspect of the invention, the next trigger event is predicted on the basis of a statistical analysis of the instants of the previous trigger events. Notably, such a statistical analysis enables to distinguish between trigger events that pertain to regular dynamic behavior from trigger events that reflect notably unpredictable irregularities. In cardiac magnetic resonance imaging, such irregularities may be R-peaks that relate to additional systoles or early or late systoles. Very good results are achieved by employing a running average over the time intervals between previous trigger events. The prediction of the next trigger event can be made more accurate by taking the running average of only the selected trigger events, e.g. on the basis of the occurrence of monitoring such the previous trigger events coinciding with a definite respiration state. Is has been found that the time interval between R-peaks coinciding with inspiration states is typically shorter than the time intervals between R-peaks coinciding with expiration states. Hence, the prediction of a next R-peak in a definite respiration state is done more accurately on the basis of the running average of time intervals between R-peaks in the respiration state at issue. Accurate results have notably been achieved by taking a running average over 10 to 20 (selected) previous trigger events. In order to emphasize the influence of some of the previous trigger events a weighted running average is employed. Notably, the weighted running average involves weights that are non-decreasing with time; that is the weights for trigger events are a non-decreasing function of time. Thus, at least some of the less recent trigger events have less weight and thus less influence in the weighted running average.

According to another aspect of the invention, the statistical analysis is implemented as a recurring estimate of the interval between the occurrences of trigger events. This implementation involves a recurrence parameter which is easily adjustable and results in an exponentially decaying weight for less recent trigger events.

The invention further relates to a magnetic resonance imaging system according to the invention as defined. A further version of the magnetic resonance imaging system of the invention is defined. The magnetic resonance imaging system of the invention is capable of performing the magnetic resonance imaging method of the invention and according performs a more accurate triggering of the acquisition of magnetic resonance signals.

The invention further pertains to a computer program as defined. When loaded into the working memory of a processor of a magnetic resonance imaging system, the computer program of the invention enables the magnetic resonance imaging system to perform the magnetic resonance imaging method of the invention. That is to achieve a more accurate triggering of the acquisition of magnetic resonance signals. The computer program can be provided on a data carrier such as a CD-rom. As another option the computer program can be downloaded from a remote site via a data network, such as the world-wide web; notably the computer program can be downloaded from a web-address of web page via the internet.

Figure 2:
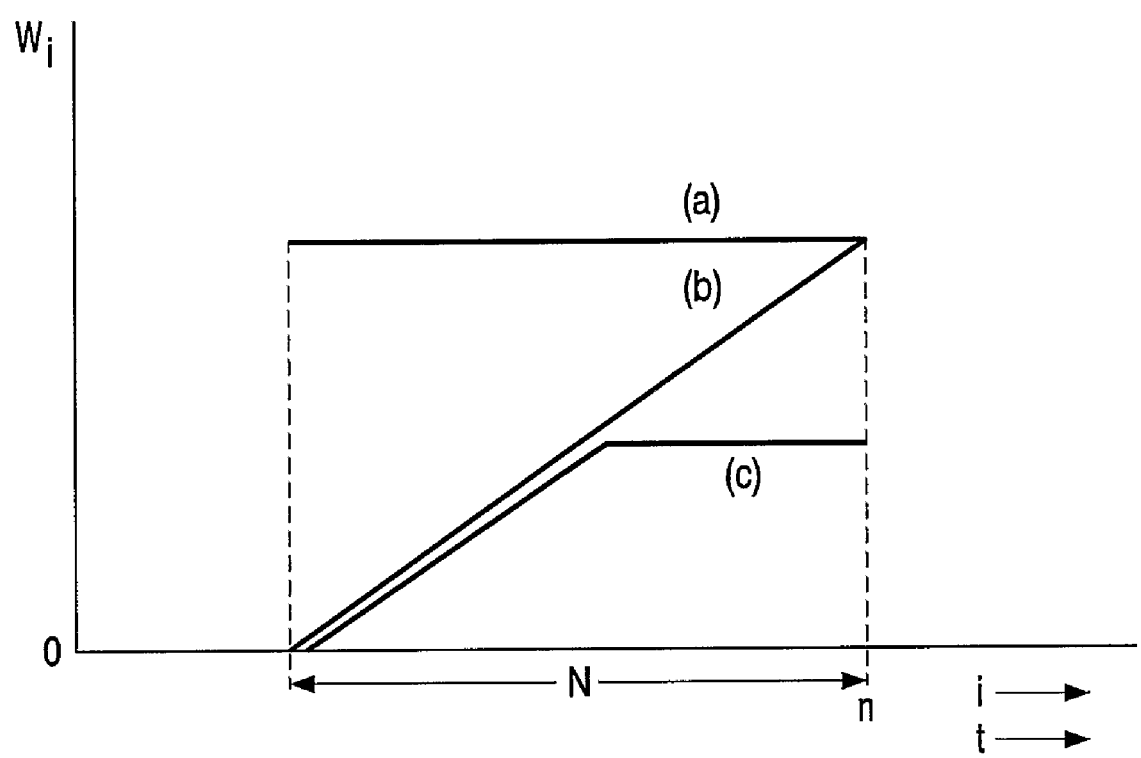

These and other aspects of the invention will be elucidated with reference to the embodiments described hereinafter and with reference to the accompanying drawing wherein FIG. 1 shows diagrammatically a magnetic resonance imaging system in which the invention is used and FIG. 2 shows a graph representing the weighting function that are employed in the running average The FIG. 1 shows diagrammatically a magnetic resonance imaging system in which the invention is used. The magnetic resonance imaging system includes a set of main coils 10 whereby the steady, uniform magnetic field is generated. The main coils are constructed, for example in such a manner that they enclose a tunnel-shaped examination space. The patient to be examined is placed on a patient carrier which is slid into this tunnel-shaped examination space. The magnetic resonance imaging system also includes a number of gradient coils 11, 12 whereby magnetic fields exhibiting spatial variations, notably in the form of temporary gradients in individual directions, are generated so as to be superposed on the uniform magnetic field. The gradient coils 11, 12 are connected to a controllable power supply unit 21. the gradient coils 11, 12 are energized by application of an electric current by means of the power supply unit 21. The strength, direction and duration of the gradients are controlled by control of the power supply unit. The magnetic resonance imaging system also includes transmission and receiving coils 13, 16 for generating the RF excitation pulses and for picking up the magnetic resonance signals, respectively. The transmission coil 13 is preferably constructed as a body coil 13 whereby (a part of) the object to be examined can be enclosed. The body coil is usually arranged in the magnetic resonance imaging system in such a manner that the patient 30 to be examined is enclosed by the body coil 13 when he or she is arranged in the magnetic resonance imaging system. The body coil 13 acts as a transmission antenna for the transmission of the RF excitation pulses and RF refocusing pulses. Preferably, the body coil 13 involves a spatially uniform intensity distribution of the transmitted RF pulses (RFS). The same coil or antenna is usually used alternately as the transmission coil and the receiving coil. Furthermore, the transmission and receiving coil is usually shaped as a coil, but other geometries where the transmission and receiving coil acts as a transmission and receiving antenna for RF electromagnetic signals are also feasible. The transmission and receiving coil 13 is connected to an electronic transmission and receiving circuit 15.

It is to be noted that it is alternatively possible to use separate receiving and/or transmission coils 16. For example, surface coils 16 can be used as receiving and/or transmission coils. Such surface coils have a high sensitivity in a comparatively small volume. The receiving coils, such as the surface coils, are connected to a demodulator 24 and the received magnetic resonance signals (MS) are demodulated by means of the demodulator 24. The demodulated magnetic resonance signals (DMS) are applied to a reconstruction unit. The receiving coil is connected to a preamplifier 23. The preamplifier 23 amplifies the RF resonance signal (MS) received by the receiving coil 16 and the amplified RF resonance signal is applied to a demodulator 24. The demodulator 24 demodulates the amplified RF resonance signal. The demodulated resonance signal contains the actual information concerning the local spin densities in the part of the object to be imaged. Furthermore, the transmission and receiving circuit 15 is connected to a modulator 22. The modulator 22 and the transmission and receiving circuit 15 activate the transmission coil 13 so as to transmit the RF excitation and refocusing pulses. The reconstruction unit derives one or more image signals from the demodulated magnetic resonance signals (DMS), which image signals represent the image information of the imaged part of the object to be examined. The reconstruction unit 25 in practice is constructed preferably as a digital image processing unit 25 which is programmed so as to derive from the demodulated magnetic resonance signals the image signals which represent the image information of the part of the object to be imaged. The signal on the output of the reconstruction is applied to the monitor 26, so that the monitor can display the magnetic resonance image. It is alternatively possible to store the signal from the reconstruction unit 25 in a buffer unit 27 while awaiting further processing.

The magnetic resonance imaging system according to the invention is also provided with a control unit 20, for example in the form of a computer which includes a (micro)processor. The control unit 20 controls the execution of the RF excitations and the application of the temporary gradient fields.

The operation of the control unit 20 is in turn regulated by a trigger unit 40 that applies trigger signals to the control unit in order to activate on the basis of the occurrence of a trigger event the magnetic resonance imaging system to acquire segments of magnetic resonance signals from respective segments of k-space. An electrocardiography unit 42, notably operating on the basis of a vector electrocardiogram, acquires ECG signals from the patient's heart. An ECG device that operates on the basis of a vector electrocardiogram is suitable be employed as the electrocardiography unit and is known as such in magnetic resonance imaging from the international application WO99/04688. The ECG signals are applied to a statistical analyzer unit 41 which makes a statistical analysis of the received ECG signals to predict the occurrence of a next trigger event. Notably, the statistical analysis unit 41 predicts when the next R-peak is the patient's ECG will occur. Further, the statistical analysis unit calculates the instant and duration of the next segment of the magnetic resonance signal acquisition controlled by the control unit 20. The statistical analysis unit for example takes account of variations in the patient's heart rate in accurately determining a time interval that accurately coincides diastolic phase in which the patient's heart is hardly moving. During that time interval the current segment of magnetic resonance signals is acquired and motion hardly affects this segment of magnetic resonance signals. The magnetic resonance imaging system of the invention is further provided with a monitor 43 which detects the monitoring events, notably in the form of the patient's respiratory state. The detected monitoring event is communicated to the statistical analysis unit 41 which takes account of the detected monitoring event in predicting the occurrence of the next trigger event. For example the monitoring unit may be arranged to measure the patient's respiratory state, that is to determine inspiration and expiration. Then the statistical analysis unit is arranged to account for a slightly longer, e.g. by 5-10% interval between R-peaks in the patient's ECG during expiration. Notably, the interval between R-peaks of an individual may vary by 5-10% between inspiration and expiration.

In particular the statistical analysis unit may be provided with software of may comprise electronic circuitry to compute the weighted running average $\langle RR \rangle_n(N)$ at trigger event at instant n for the latest N (i=1, . . . N) R-R intervals using a weighting function $w_i$:

$$\langle RR \rangle_n(N) = \frac{\sum_{i=1}^{N} RR_{i+n-N-1} W_i}{\sum_{i=1}^{N} W_i}$$

then the next R-R interval is predicted to equal the current weighted running average:

$$RR_{n+1} = \langle RR \rangle_n(N)$$

As a further refinement, the weighting function $w_i$ is a non-decreasing function or an increasing function as a function of time. Examples are shown in the graphs in FIG. 2. In FIG. 2 the value of the weighting factor is plotted as a function of successive trigger events, or equivalently of time. The current instant is indicated as point n. Graph (a) shows a simple weighting factor that has a constant value in the interval (n-N, n). Graph (b) shows a weighting factor that linearly increases in the interval (n-N, n). Graph c shows a weighting factor that linearly increases in an interval (n-N,j) and remains constant in an interval (j,n). As the weights are smaller for R-R intervals that occurred longer ago, the weighted running average provides a more accurate prediction of the patient's current heart rate. Further, the weights ($w_i'$ instead of $w_i$) can be made dependent on the detected monitoring events, such as the patient's respiration and/or on irregularities in the ECG, such as arrhythmias:

$$w_i' = w_i f(G_i) g(RR_i)$$

where $w_i$ is one of the non-decreasing functions shown in FIG. 2, f is a function of the respiratory gate acceptance and g is a function of the current duration of the R-R interval. Several alternatives of the gate acceptance are possible: the simplest is to accept all (f=1, g=1). Arrhythmic R-R intervals may be excluded for example $g(RR_i)=0$ if $RR_i \leq A \cdot \langle RR \rangle_i(N)$, where the parameter A is an adjustable multiplier; good results are achieved for A=0.5. That is trigger events, i.e. a detected R-peak, that occurs earlier than half of the current running average are rejected. The function f may also implement a respiratory acceptance gating in that $$f(G_i) = \begin{cases} 1 \text{ if } G_i = 1 \\ 0 \text{ if } G_i = 0. \end{cases}$$

A further refinement is achieved by combining the respiratory acceptance gating with the exclusion of arrhythmic R-R intervals.

Yet another implementation of the computation of the weighted running average is a recursive running average:

$$\langle RR \rangle_n(N) = aRR_n + (a-1)\langle RR \rangle_{n-1}(N)$$

which leads to a temporal weighting function that exponentially decays into the past.

Another alternative is to employ Kalman filtering to predict the next R-R interval. Kalman filters are known as such from 'A new approach to linear filtering and prediction problems' in Trans AMSE, J. Basic Engineering 82 series D(1060)35-45. To this end, the computer program according to the invention is loaded, for example, into the control unit 20 and the reconstruction unit 25.

The invention claimed is:

1. A magnetic resonance imaging method, including:
   detecting a series of trigger events;
   detecting a series of monitoring events;
   predicting the occurrence of a impending trigger event on the basis of at least part of the detected series of trigger events and detected series of monitoring events; and
   triggering a magnetic resonance device to acquire at least one segment of magnetic resonance signals based on the predicted trigger event.

2. The magnetic resonance imaging method as claimed in claim 1, further including:
  detecting the impending trigger event; and
  comparing the detected impending trigger event and the predicted impending trigger event.

3. The magnetic resonance imaging method as claimed in claim 2, wherein predicting the occurrence of the impending trigger event is based on previous comparisons of the detected impending trigger event and the predicted impending trigger event.

4. The magnetic resonance imaging method as claimed in claim 1, wherein predicting the occurrence of the impending trigger event includes:
  performing statistical analysis of the at least part of the detected series of trigger events and detected series of monitoring events.

5. The magnetic resonance imaging method as claimed in claim 4, wherein performing the statistical analysis includes determining a running average of time intervals between individual trigger events of the at least part of the detected series of trigger events.

6. The magnetic resonance imaging method as claimed in claim 5, wherein the statistical analysis involves a weighted running average or a recurring estimate of the interval between individual trigger events of the at least part of the detected series of trigger events.

7. The magnetic resonance imaging method as claimed in claim 4, wherein the analyzer unit modifies a value associated with the predicted trigger event by 10-15% based on the detected series of monitoring events.

8. The magnetic resonance imaging method as claimed in claim 5, wherein the running average is taken over a range of 10 to 20 individual trigger events of the at least part of the detected series of trigger events or detected series of monitoring events.

9. The magnetic resonance imaging method as claimed in claim 1, wherein the trigger event includes an R-peak of a patient's electrocardiogram (ECG).

10. The magnetic resonance imaging method as claimed in claim 1, wherein the monitoring event includes a respiratory state of a patient.

11. A magnetic resonance imaging system comprising
  a control unit to control the operation of the magnetic resonance imaging system;
  a detection unit to detect trigger events;
  a monitoring unit to detect a monitoring event;
  an analysis unit to predict an impending trigger event from the detected trigger and monitoring events; and
  a trigger unit to supply a trigger signal to activate the control unit based on the predicted impending trigger signal.

12. The magnetic resonance imaging system as claimed in claim 11, wherein
  the monitoring unit is coupled to the analysis unit so as to adjust the analysis unit on the basis of the detected monitoring event.

13. The magnetic resonance imaging system as claimed in claim 11, wherein
  the detection unit includes an electrocardiography unit; and
  the monitoring unit includes a respiratory state measurement unit.

14. A computer readable memory device carrying computer program instructions which when executed by a processor perform the steps of:
  detect a series of trigger events;
  detect a series of trigger events;
  predict the occurrence of an impending trigger event based on at least a part of the detected series of trigger events and the detected series of monitoring events; and
  trigger acquisition of at least one individual segment of magnetic resonance signals based on the predicted trigger event.

15. The computer readable memory device as claimed in claim 14, wherein the computer program further include instructions to:
  select a portion of the detected series of trigger events based on occurrence relative to the detected series of monitoring events.

16. A magnetic resonance imaging method, including
  detecting a series of R-peaks in a patient ECG;
  detecting a respirator state of the patient;
  predicting the time instance of a impending R-peak based on at least part of the detected series of R-peaks;
  adjusting the predicted time instance of the impending R-peak by a percentage based on the respiratory state of the patient; and
  triggering a magnetic resonance device to acquire at least one segment of magnetic resonance signals based on the adjusted time instance of the predicted impending R-peak.

17. The magnetic resonance imaging method as claimed in claim 16,
  wherein predicting the time instance of the R-peak is based on a weighted running average of a time interval between adjacent R-peaks of the detected series of R-peaks.

18. A magnetic resonance imaging method as claimed in claim 16,
  wherein predicting the time instance of the R-peak is based on comparisons of previously detected R-peak and a corresponding previously predicted R-peak.

* * * * *